United States Patent [19]
Barrett

[11] Patent Number: 5,373,417
[45] Date of Patent: Dec. 13, 1994

[54] LIQUID-COOLED CIRCUIT PACKAGE WITH MICRO-BELLOWS FOR CONTROLLING EXPANSION

[75] Inventor: Fredrick W. Barrett, Glendale, Ariz.

[73] Assignee: Motorola, Inc., Schaumburg, Ill.

[21] Appl. No.: 202,604

[22] Filed: Feb. 28, 1994

[51] Int. Cl.⁵ .............................................. H05K 7/20
[52] U.S. Cl. .................................. 361/699; 165/80.4; 257/714
[58] Field of Search ............... 165/80.4; 257/713, 714; 361/689, 690, 691, 698–699, 720

[56] References Cited
U.S. PATENT DOCUMENTS

| | | | |
|---|---|---|---|
| 3,091,722 | 5/1963 | Borowiec et al. | 361/689 |
| 3,986,080 | 10/1976 | Sato | 361/689 |
| 5,305,184 | 4/1994 | Andresen et al. | 361/399 |

FOREIGN PATENT DOCUMENTS 2067791  3/1990  Japan .................................. 361/689

*Primary Examiner*—Gregory D. Thompson
*Attorney, Agent, or Firm*—Robert D. Atkins

[57] ABSTRACT

The heat dissipation and mechanical stability of an electronic circuit module package (10) is enhanced by filling the module cavity (20) with a perflourinated hydrocarbon cooling liquid, and by placing a micro-bellows (24, 28) within the module cavity. The temperature compression and expansion characteristics of the perflourinated hydrocarbon liquid are compensated by the action of the micro-bellows. The module package contains semiconductor die (16, 18) that require cooling during operation. The perflourinated hydrocarbon liquid provides the necessary heat transfer to the module package.

5 Claims, 1 Drawing Sheet

LIQUID-COOLED CIRCUIT PACKAGE WITH MICRO-BELLOWS FOR CONTROLLING EXPANSION

BACKGROUND OF THE INVENTION

The present invention relates in general to heat dissipation in semiconductors and, more particularly, to direct contact liquid cooling in electronic circuit module packages.

It is known in the art that combinations of various type semiconductors and/or hybrid circuits are required to achieve large scale electronic systems. It is desired that the packaging of these system functions be miniaturized in modular form to optimize cost, size, and weight advantages for the end user. The electronic systems often consume an appreciable amount of power and generate heat. As the level of modular system integration increases, the size of the module and the power consumption of the module correspondingly increases.

The electronic systems are often used at various pressure altitudes including submerged applications and high altitude applications. In some applications, conventional package cooling techniques such as convection and radiation may be inadequate to assure sufficient cooling and reliable electronic system performance. Likewise, package pressure constraints that are related to a wide range of pressure altitude variations have not been adequately addressed with present module technology to provide a universal pressure solution.

Hence, a need exists for an electronic circuit module package that is capable of reliable operation at various atmospheric and sub-surface altitudes and maintains good heat dissipation characteristics throughout its range of operation.

DETAILED DESCRIPTION OF THE PREFERRED EMBODIMENT

Generally, the present invention provides direct contact liquid cooling of integrated circuit die and hybrid circuits placed within the cavity of an electronic circuit module package. The present invention further controls the expansion of the cooling liquid within the module. An inert cooling liquid is displaced within the cavity of the module to provide a heat dissipation medium between the semiconductor die and the module package. The inert cooling liquid also acts as a mechanical support to the package cover. A micro-bellows assembly affixed within the module cavity buffers the pressure differential between the external module environment and the internal module cavity to maintain mechanical stability to the package. The micro-bellows compensates for the varying volume of the cooling liquid residing within the module package.

Figure 1:
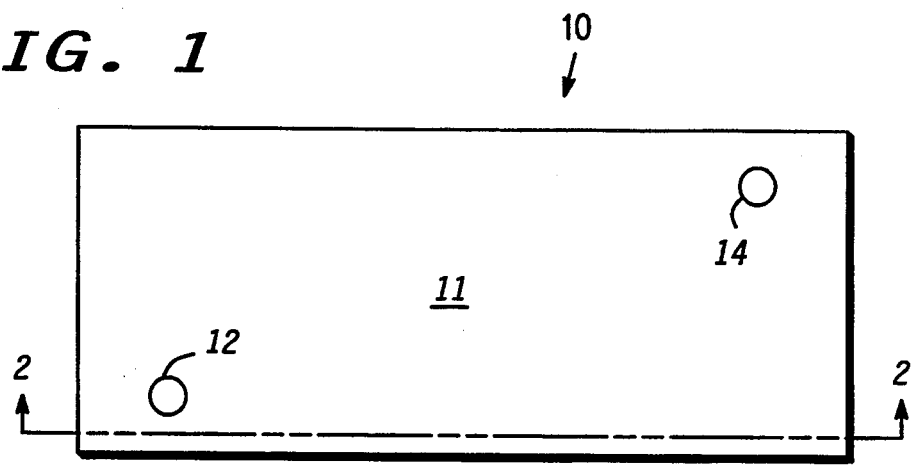
FIG. 1 illustrates a top view of an electronic circuit module package.

Referring to FIG. 1, module package 10 includes module lid 11, a fill inlet port 12 and an exhaust port 14 diagonally opposite the inlet port. Module package 10 including module lid 11 is fabricated from kovar metal or a ceramic material.

Figure 2:
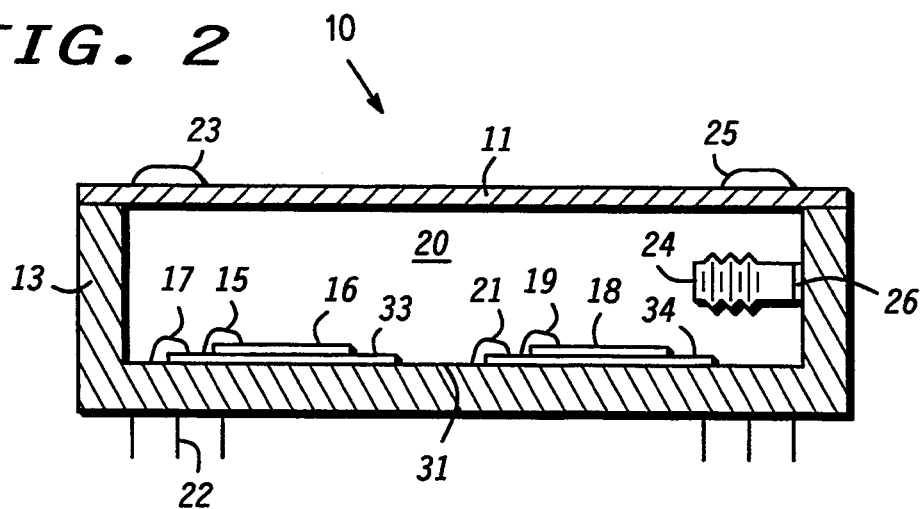
FIG. 2 illustrates a cross sectional view of an electronic circuit module package.

FIG. 2 is a cross-sectional view of module package 10 as indicated in FIG. 1 by line 2—2. Module lid 11 is shown attached to module sidewalls 13 using seam welding techniques to rigid form module cavity 20. Alternately, conventional solder seal techniques may be used to provide the seal. Semiconductor die 16 is attached within module cavity 20 to ceramic substrate 33 using die attach techniques before module lid 11 is attached. The assembly of semiconductor die 16 and ceramic substrate 33 is further attached to module floor 31 with thermally conductive epoxy. Similarly housed within module cavity 20 is an assembly of semiconductor die 18 attached to ceramic substrate 34 that is further attached to module floor 31. Substrates 33 and 34 may be fabricated from alumina, diamond, or metallic materials. Electrical interconnects between metal patterns on semiconductor dies 16 and 18 to metal patterns on substrates 33 and 34 is achieved respectively through bond wires 15 and 19. Bond wires 17 and 21 further connect the metal patterns of substrates 33 and 34 respectively to associated external module connector pins 22. In another embodiment of the invention, semiconductor dies 16 and 18 may be directly attached to the substrate floor with a thermal epoxy.

As part of the present invention, a micro-bellows assembly 24 is attached to the rigid module sidewall 13 with epoxy 26. The selection of micro-bellows 24 is made from commercially available sources with attention paid to matching the compression and expansion characteristics of micro-bellows 24 to the change in density of the perflourinated hydrocarbon liquid under varying temperature conditions to provide a constant cavity volume.

An inert cooling agent, e.g. a perflourinated hydrocarbon liquid, is infused under pressure through inlet port 12 during manufacture. Excess liquid coolant comes out exhaust port 14. The selection of the appropriate perflourinated hydrocarbon is made such that it remains in a liquid state throughout the operational temperature range of module package 10. Once module cavity 20 is filled, inlet port 12 is sealed with epoxy seal 23 followed by sealing exhaust port 14 with epoxy seal 25. The pressure used to force the perflourinated hydrocarbon liquid into the cavity is sufficient to cause micro-bellows 24 to partially compress forming a stable volume unit within module cavity 20. This portion of the assembly process may be performed at a temperature of say 25 degrees Celsius. It is also desirable to perform the process in a vacuum type environment.

Under application of electrical power to one or more of the external module pins 22, semiconductor dies 16 and 18 experience a rise in temperature as they reach steady-state operation. The heat from semiconductor dies 16 and 18 is transferred to the perflourinated hydrocarbon liquid creating a temperature gradient with the temperature of the liquid near the surfaces of semiconductor dies 16 and 18 being greater than the temperature of the liquid more distant from semiconductor dies 16 and 18. As a result a convection system is established causing the heat generated in the semiconductor dies to be dissipated throughout module package 10.

As the temperature of the perflourinated hydrocarbon liquid changes, the density of the liquid also changes. The change in density is compensated by the expansion and contraction of micro-bellows 24 to maintain a constant volume within module cavity 20 and thus provide consistent mechanical support for module lid 11. For example, at lower temperatures, the perflourinated hydrocarbon liquid becomes more dense causing the liquid to compress and micro-bellows 24 to expand. Likewise, as temperatures increase, the perflourinated hydrocarbon liquid becomes less dense causing the cooling liquid to expand and micro-bellows 24 to compress. A proper liquid selection results in a linear change in liquid density over the required temperature range. As external atmospheric conditions vary, the micro-bellows also provides additional compensation for the module package support.

Figure 3:
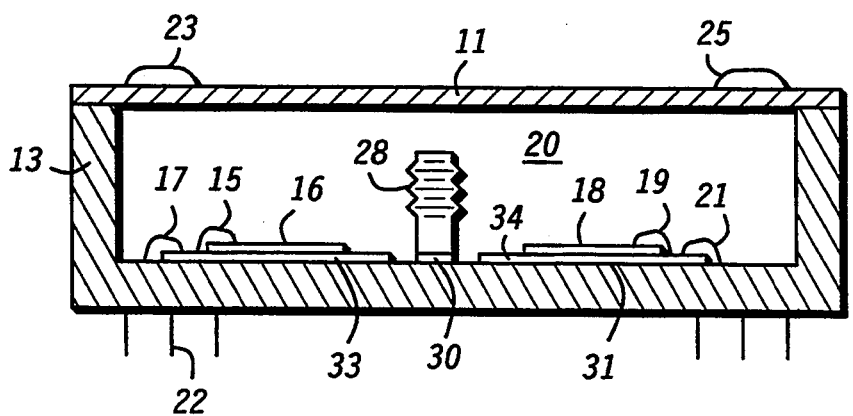
FIG. 3 illustrates a cross-sectional view of an alternate embodiment of the electronic circuit module package.

Referring to FIG. 3, an alternate embodiment of the invention shows micro-bellows 28, affixed to floor 31 of module base 13 using epoxy 30. The placement of the micro-bellows 28 is such to facilitate the layout of the semiconductor dies 16 and 18 housed within the module cavity 20. Micro-bellows 28 is also located so that it will not impede the cooling mechanism of module package 10 from the semiconductor dies through the cooling liquid to module lid 11 and the surfaces of sidewalls 13. In additional embodiments of the invention, the micro-bellows could be integrally formed as a part of module sidewalls 13 rather than attach with epoxy.

By now it should be appreciated that the present invention provides direct contact liquid cooling of integrated circuit die and hybrid circuits placed within the cavity of an electronic circuit module package while controlling the expansion of the cooling liquid within the module by use of a micro-bellows. The cooling liquid provides a heat dissipation medium between the semiconductor die and the module, and further provides mechanical support to the package cover. The micro-bellows affixed within the module cavity buffers the pressure differential between the external module environment and the internal module cavity to maintain mechanical stability to the package. The micro-bellows further compensates for the varying volume of the cooling liquid residing within the module.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A circuit package, comprising:
   a package having rigid walls forming a sealed cavity;
   a circuit mounted within said sealed cavity of said package;
   a liquid coolant filling said sealed cavity of said package and contacting a surface of said circuit and said rigid walls of said package; and
   a micro-bellows mounted to one of said rigid walls within said sealed cavity for controlling expansion of said liquid coolant within said sealed cavity of said package.

2. The circuit package of claim 1 wherein said micro-bellows is mounted to one of rigid walls said within said sealed cavity with an epoxy.

3. The circuit package of claim 1 wherein said liquid coolant is perflourinated hydrocarbon liquid.

4. A method of liquid cooling a circuit package, comprising the steps of:
   enclosing the circuit package with rigid walls to form a cavity
   mounting a circuit within said cavity;
   filling said cavity with a liquid coolant;
   sealing said cavity to form a sealed cavity;
   dissipating heat generated by said circuit through said liquid coolant to said rigid walls; and
   controlling expansion of said liquid coolant within said sealed cavity with a micro-bellows mounted to one of said rigid walls.

5. The method of claim 4 further including the step of mounting said micro-bellows to one of said rigid walls with an epoxy.

* * * * *